(12) United States Patent
Zhu

(10) Patent No.: US 8,319,495 B1
(45) Date of Patent: Nov. 27, 2012

(54) MULTI-PORT RF SYSTEMS AND METHODS FOR MRI

(76) Inventor: Yudong Zhu, Scarsdale, NY (US)

( * ) Notice: Subject to any disclaimer, the term of this patent is extended or adjusted under 35 U.S.C. 154(b) by 360 days.

(21) Appl. No.: 12/606,135

(22) Filed: Oct. 26, 2009

Related U.S. Application Data

(60) Provisional application No. 61/108,554, filed on Oct. 27, 2008.

(51) Int. Cl.
  *G01V 3/00* (2006.01)
(52) U.S. Cl. .......... 324/307; 324/309
(58) Field of Classification Search .......... 324/300–322; 600/407–445
  See application file for complete search history.

(56) References Cited

U.S. PATENT DOCUMENTS

| | | | |
|---|---|---|---|
| 4,825,162 A | 4/1989 | Roemer et al. | |
| 6,411,090 B1 * | 6/2002 | Boskamp | 324/318 |
| 6,819,274 B2 * | 11/2004 | Krone et al. | 341/141 |
| 6,828,790 B2 | 12/2004 | Katscher et al. | |
| 6,879,158 B2 | 4/2005 | Zhu | |
| 6,969,992 B2 | 11/2005 | Vaughan et al. | |
| 7,385,396 B2 | 6/2008 | Zhu | |
| 2010/0219694 A1 * | 9/2010 | Kurs et al. | 307/104 |
| 2012/0256494 A1 * | 10/2012 | Kesler et al. | 307/104 |

OTHER PUBLICATIONS

R. Lattanzi, D. Sodickson, A. Grant and Y. Zhu, "Electrodynamic constraints on homogeneity and RF power deposition in multiple coil excitations", Magnetic Resonance in Medicine, 61:315-334, 2009.

* cited by examiner

*Primary Examiner* — Brij Shrivastav

(57) ABSTRACT

Optimizing RF coil currents' magnitude/phase relationship, temporal modulation and spatial distribution is crucial to MR imaging performance. One key aspect for the optimization is the knowledge of B1 spatial distribution and RF power deposition associated with a coil current pattern or a source configuration, and the use of the knowledge in the optimization. Another key aspect for the optimization is a hardware infrastructure that facilitates the optimization, with, specifically, a coil structure that supports flexible current path control. The present invention relates to calibration methods and multi-channel parallel RF transmit/receive coil assemblies that improve the performance of MR imaging by addressing both aspects.

20 Claims, 6 Drawing Sheets

MULTI-PORT RF SYSTEMS AND METHODS FOR MRI

This application claims the benefit of PPA Application No. 61/108,554 filed 2008 Oct. 27 by the present inventor, which is incorporated by reference.

BACKGROUND OF THE INVENTION

The present invention relates generally to magnetic resonance (MR) imaging and, more particularly, to multi-channel or multi-port parallel RF transmit (Tx)/receive (Rx). The present invention further relates to a calibration method and a multi-channel parallel RF transmit/receive coil assembly that improve the performance of MR imaging.

When radio-frequency signal gets transmitted/detected during MR imaging, it is the $B1^+/B1^-$ fields in the object, not the driving/induced currents in the RF coil structure, that interact directly with the spin system (nuclei) of an imaged object. The concomitant E field meanwhile gives rise to RF loss in the object and dictates RF power deposition/noise. Yet the coil currents play a central role—they act as the link between Tx/Rx system electronics and the RF electromagnetic fields, and serve to implement the control of the RF electromagnetic fields for MR imaging.

One suitable perspective for analyzing Tx/Rx in a multi-port setting is as follows: (a) During Tx, predetermined RF pulses, through an array of RF power amplifier, drive currents in the RF coil structure. The currents in turn drive the B1 field, whose $B1^+$ component excites the spins in the object out of equilibrium and causes them to precess. The RF loss associated with the concomitant E field causes RF energy deposition in the object (RF power dissipation through Joule heating and polarization damping forces=$\int(\sigma+\omega\epsilon'')|E|^2 dv$). (b) During Rx, the rotating magnetization due to the precessing spins generates an electromotive force in the RF coil structure, which induces currents in accordance with the $B1^-$ component of the B1 field. The currents are detected by an array of RF receivers, giving rise to time signals that are used to reconstruct MR images. The RF loss associated with the concomitant E field in this case contributes to the noise in the received time signal data. Note that with both Tx and Rx, the EM field distribution and RF loss are object-dependent. Also note that the B1-spin interaction is commonly modulated in space by the gradient pulses that are played out during Tx/Rx. This spatial modulation is an integral part of the excitation/detection scheme that control the profile of the spin excitation/the mapping of the MR signal.

Optimizing the coil currents' magnitude/phase relationship, temporal modulation and spatial distribution is crucial to MR imaging performance. One key aspect for the optimization is the knowledge of B1 spatial distribution and RF power deposition associated with a coil current pattern or a source configuration, and the use of the knowledge in the optimization. Another key aspect for the optimization is a hardware infrastructure that facilitates the optimization. In addition to independent exciters and receivers, having a coil structure that supports flexible current path control is crucial. This application describes new systems and methods that address these aspects and improve MR imaging performance.

Parallel RF transmit offers unmatched capacity in containing specific absorption rate (SAR) in the mean time of realizing high quality RF excitation. However, there has not been a viable method that, under in vivo conditions, effectively taps into this capacity and realizes imaging performance enhancement with SAR reduction. In fact the substantially increased degrees of freedom inherent of parallel transmit, which are the very foundation of this capacity, tend to spur a concern that improper RF pulse or shimming calculations, or multi-channel hardware failure, may inadvertently exacerbate SAR, as opposed to reducing it. One can address this concern to some extent by monitoring RF power at the ports, where power meters are implemented to measure individual port forward and reflected power, calculate in real-time net forward power into the subject and stop scan when the overall SAR reaches a threshold. To adequately addresses safety/performance issues however one must complement existing real-time monitoring with a proactive scheme that has the ability to: 1) predict SAR consequence of an imaging sequence on the subject before the MR scan, and 2) further optimize the RF pulses to minimize SAR while still achieving the target excitation profile.

What is critically needed in general are practicable quantitative SAR prediction models that, given any set of B1 shimming coefficients or RF excitation pulses, predict the SAR consequences globally, with a volumetric average, and/or locally at locations of interest, with regional averages.

In principle, for multi-port RF pulse calculation (including B1 shimming and full fledged parallel transmit) one can explicitly minimize SAR by guiding the design with predictive models that track SAR, and in the case of hardware failure management, avert hazardous outcome by presetting a safety margin based on the same models. During an MR scan, these models can act as "software" SAR monitors, which extend the capability of the power meter reading-based global SAR monitoring scheme with the ability to predict and map SAR.

There are evidences showing that, in addition to pulse calculation, RF coil (antenna) geometry substantially impacts the performance of multi-channel or multi-port Tx and Rx. Fundamentally, a coil structure that supports flexible current path control is essential for pushing parallel Tx and Rx performances to their limits. This is consistent with the view that RF pulses modulate coil currents, which in turn drive RF electromagnetic fields, which ultimately dictating Tx/Rx performance. What is needed is an RF coil structure that forms a multi-port and substantially dense network thereby capable of accommodating and effecting sophisticated RF current distribution patterns.

BRIEF DESCRIPTION OF THE DRAWINGS

The drawings illustrate one preferred embodiment presently contemplated for carrying out the invention.

In the drawings.

DETAILED DESCRIPTION

Figure 1:
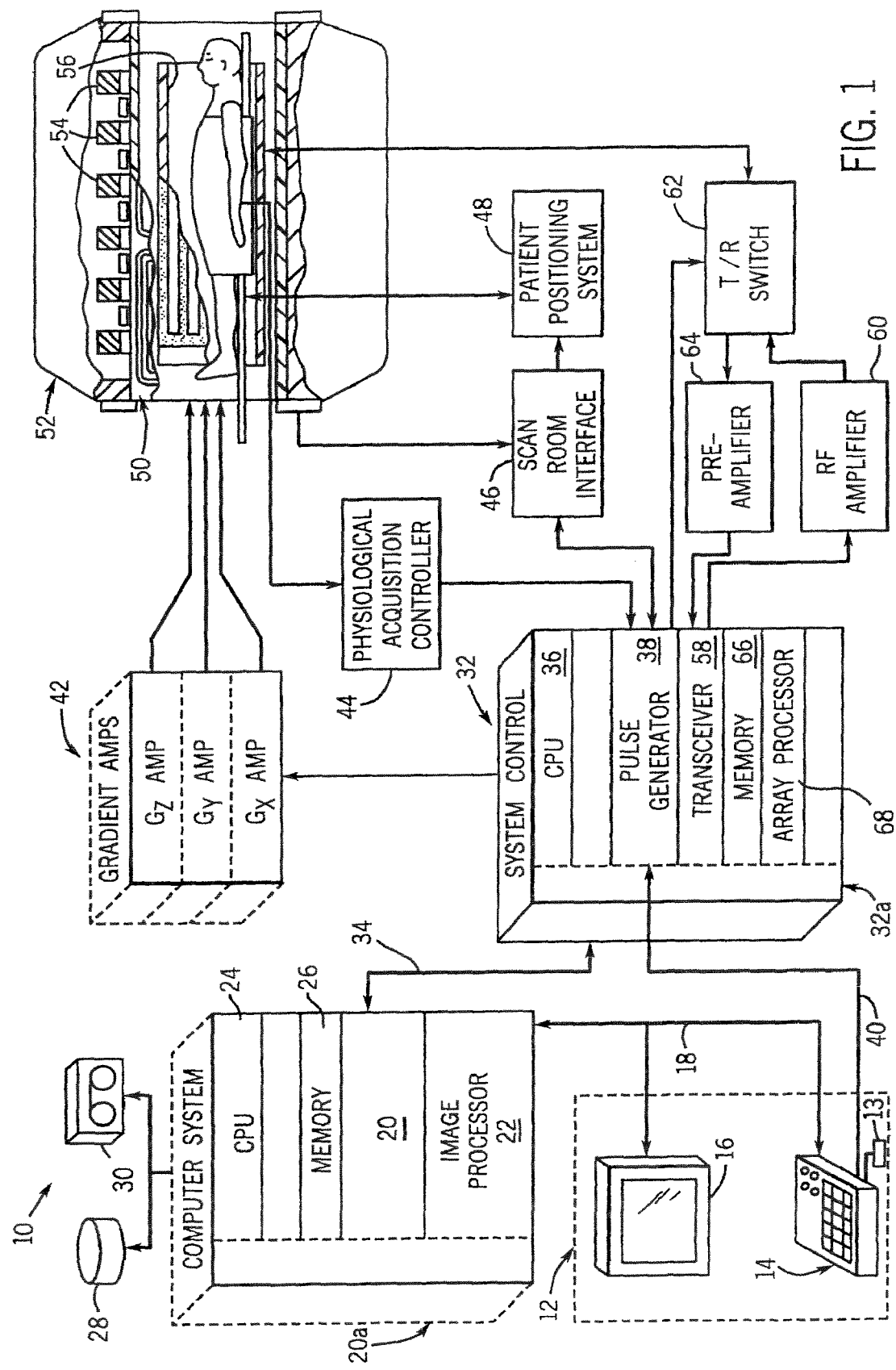
FIG. 1 is a schematic block diagram of an MR imaging system for use with the present invention.

Referring to FIG. 1, the major components of a preferred magnetic resonance (MR) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates, for RF transmit, the timing, strength and shape of the RF pulses produced, and, for RF receive, the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data to combine MR signal data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to methods and systems operating RF excitation/MR signal reception in parallel. This parallel excitation/reception supports reduction in scan time through the acceleration of RF pulses/the localization of MR signal, as well as possible improvements in managing SAR/SNR.

An exemplary approach is described below with respect to providing a means for predicting RF energy transmission/dissipation as well as B1 field distribution based on a finite number of measurements.

Figure 2:
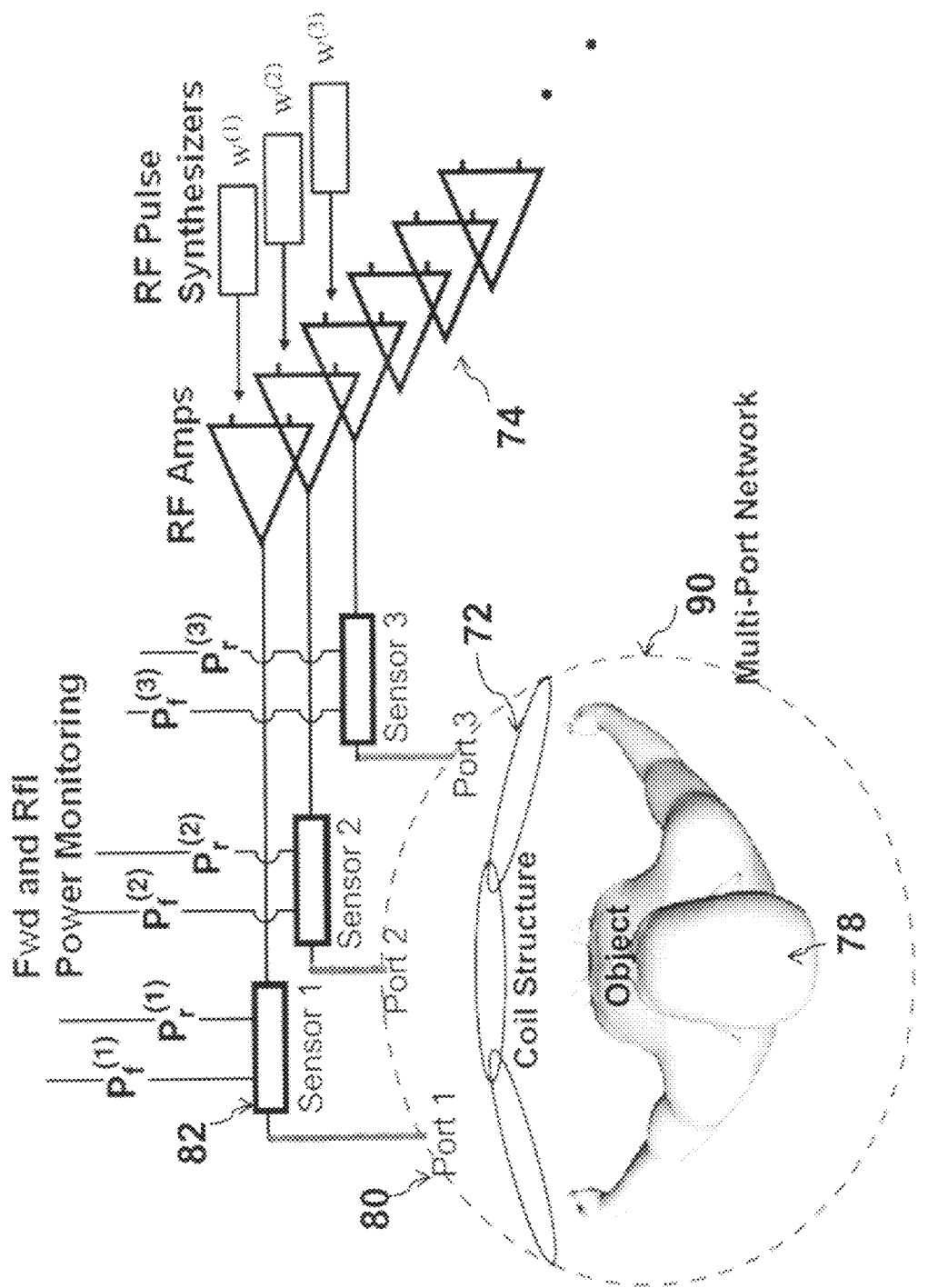
FIG. 2 is a schematic block diagram illustrating an exemplary parallel transmit system setup in accordance with one aspect of the present invention.

The knowledge of B1 distribution and RF loss associated with a source configuration can be obtained using appropriate system models together with measurement data from a calibration process. A source configuration refers to a set of predetermined RF pulses in the Tx case and a set of image reconstruction weights applied to the acquired signal samples in the Rx case. An analysis using a multi-port concept can be powerful—an example is illustrated in FIG. 2. The imaged object 78 and the RF coil structure 72 of an MR imaging experiment can be viewed as a multi-port network 90 that interacts with a plurality of sources through the ports 80. During Tx the ports are connected to the output terminals of the RF power amplifiers 74. During Rx the ports are connected to the input terminals of the preamplifiers of the receivers (not shown). The different routing is achieved with T/R switches.

The core idea is to run calibration experiments using an appropriate set of source configurations and record the responses of the multi-port system. In calibrating for Tx, the results are then used to quantify the relation between the predetermined RF pulses and the system's response, which in turn allows the prediction of system's response to any predetermined RF pulses.

Multi-port Tx/Rx system hardware is normally set up in such a way that the electromagnetic field induced in the object responds linearly to the sources. In the Tx case, provided that the RF power amplifiers (which amplify predetermined RF pulses and drive the multiple ports) satisfy proper linearity specs, each amplifier presents to the multi-port network equivalently a voltage source in series with an output impedance, where the voltage source correlates linearly to the predetermined RF pulse fed to the amplifier's input terminal. In this case linearity of Maxwell equations dictates that the electromagnetic field responds linearly to the voltage sources as well as to the RF pulses. It follows that any electromagnetic field component at a location within the object, as a function of time, can be expressed as $$b(t) = \mathcal{L}(v^{(1)}(t), v^{(2)}(t), \ldots, v^{(N)}(t)),$$  Exemplary equation 1 where $\mathcal{L}$ represents a linear mapping, $b(t)$ denotes the electromagnetic field component, $v^{(n)}(t)$'s are the predetermined RF pulses, and N is the number of Tx ports.

In a steady state analysis one can use a phaser notation to capture any time variable of interest (e.g., a voltage source, current through a cross section of a conductor, or a component of an EM field vector). Specifically one can express a time variable using a complex variable, with the understanding that the true variable is constructed by taking the real part of the product of the complex variable with $\exp(j2\pi f_0 t)$.

The phaser notation simplifies the description of the RF events in MR. In practice system electronics effect control over a sequence of consecutive $\Delta t$-long time intervals, with $\Delta t$ equaling to, e.g., 2 usec. A predetermined RF pulse is in effect the outcome of updating, at the beginning of each of a sequence of consecutive $\Delta t$-long intervals, a sinusoidal waveform of frequency $f_0$ with a weight, which is a complex scalar $w_p^{(n)}$ (n=port index and p=interval index) specifying a magnitude-phase pair. A complete set of weights, one set for each of the sequence of $\Delta t$ intervals, comes from a so-called RF pulse design process.

The phaser notation is suitable for analyzing the steady state within each $\Delta t$ interval. For example, at location r inside the object and within the pth $\Delta t$ interval, the E field can be expressed as $E(r,t)=[\alpha_x(r)\cos(\omega_0 t+\phi_x(r))\ \alpha_y(r)\cos(\omega_0 t+\phi_y(r))\ \alpha_z(r)\cos(\omega_0 t+\phi_z(r))]$. The corresponding phaser notation for E is a complex vector: $E_p(r)=[\alpha_x(r)\exp(j\phi_x(r))\ \alpha_y(r)\exp(j\phi_y(r))\ \alpha_z(r)\exp(j\phi_z(r))]$. For the same interval, the phasor notation for the predetermined RF pulse for the nth port is the complex scalar $w_p^{(n)}$.

Over a $\Delta t$ interval, a linear system behavior captured by Eqn.1-type equations can be expressed in a matrix form using the phaser notation:

$$b=Aw, \qquad \text{Exemplary equation 2}$$

where $b=[b^{(1)} b^{(2)} \ldots b^{(M)}]^T$ is a vector collecting phaser representations of the time variables of interest, $w=[w^{(1)} w^{(2)} \ldots w^{(N)}]^T$ is a vector collecting the definitions for the predetermined RF pulses—the nth entry is the complex scalar corresponding to the pair of magnitude and phase values for the $\Delta t$ interval and the nth port—and A is an M-by-N matrix with complex-valued entries.

EM field calibration probes the multi-port network with a judiciously selected set of input configurations. The EM field responses measured together with an appropriate system model are used to predict the EM field response to any input configuration.

An MR system with linearity adequately maintained facilitates EM field calibration. Eqn.2 suggests that, based on linearity, EM field responses measured in N experiments that employ linearly independent input configurations are sufficient for predicting the EM field response to any input configuration, as matrix A can be fully determined from the measured EM field responses and the prescribed inputs:

$$[b_1 b_2 \ldots b_N]=A[w_1 w_2 \ldots w_N] \Rightarrow A=[b_1 b_2 \ldots b_N][w_1 w_2 \ldots w_N]^{-1} \qquad \text{Exemplary equation 3}$$

Eqn.3 pools Eqn.2-type equations together, with the experiment index shown as subscripts. Note that existence of the inverse of matrix $[w_1 w_2 \ldots w_N]$ is guaranteed due to the linear independence of the input configurations. As a straightforward example, one can calibrate Tx EM fields with N experiments, where the nth experiment (n=1,2, N) involves driving the nth port with a unit-amplitude rectangular RF pulse (a finite-duration sinusoid of unit amplitude, zero initial phase and frequency $f_0$) and the other ports with zero-amplitude RF pulses. In this case $[w_1 w_2 \ldots w_N]$ is an identity matrix, which leads to $A=[b_1 b_2 \ldots b_N]$.

For multi-port parallel excitation, which includes multi-port B1 shimming as a special case, the Eqn.3-based principle can serve as the foundation for predicting B1+, a prerequisite of the RF pulse design process. In this case $b_n$ is a vector collecting the spatial samples of the B1+ map measured in the nth experiment (n=1,2, ... N). With A determined following the Eqn.3-type calibration scheme, the spatiotemporal variation of the B1+ field, and further, the spin excitation profile, can be predicted for any set of RF pulses, which allows excitation profile control through the design and application of appropriate RF pulses.

In producing a target excitation profile, one must avoid excessive RF energy dissipation in the object. This can be addressed in the RF pulse design process through the introduction of a proper metric that tracks RF loss. For example, design of RF pulses could be formulated as a constrained minimization problem, where one searches for RF pulses that create the target excitation profile while inducing an E field with minimum ensuing SAR.

Pennes Bio-heat equation describes thermal energy balance for perfused tissue. RF energy dissipation, when present, becomes a driving force of temperature rise, as captured by Pennes equation:

$$\rho C \frac{\partial T}{\partial t} = \nabla \cdot (k \nabla T) + h_b + h_e$$

where $\rho$, C and k refer to tissue density, heat capacity and thermal conductivity respectively, $h_b$ is the blood-to-tissue heat transfer rate, and $h_e$ is the local RF energy deposition rate. With increased RF energy deposition, excessive tissue heating may result.

Note that $h_e$ is due to Joule heating and polarization damping forces, and is thus proportional to the square of local E field strength: $h_e=\frac{1}{2}\sigma|E|^2$, where $\sigma=\sigma_{tissue}+\omega\epsilon''$.

Because of differences in body geometry and composition, as well as increased RF field's wave behavior and source-subject interaction at high radio frequencies, electric field and RF power deposition are substantially subject dependent. To address this issue, methods have been proposed that combine results of full wave simulation of SAR in an "average" human model with actual geometry and field measurements. However there are concerns that outcomes of such a hybrid approach can be susceptible to large errors in high field MR, where small differences in coil-subject configuration often lead to significant, difficult-to-reconcile differences between a specific outcome and that of an "average". To accurately predict SAR and to improve MR performance, one needs to establish SAR prediction models based on actual subject-specific measurements.

From the perspective of advancing MR imaging, especially in the area of high field MR, it appears inevitable that one will need to carry out in vivo SAR model calibration for managing SAR, just as one needs to perform B1 map calibration for managing excitation profile. To maximize performance given a scan setup, one uses B1 and SAR calibration results as key inputs to guide, on a per subject basis, optimization of pulse or shimming calculations. To further improve the setup itself, one uses a survey of calibration results as key inputs to guide optimization of RF system and coils. In line with this vision for future high field MR, this invention creates and uses SAR prediction models at two levels: global SAR, and local SAR at any location of interest.

As described earlier one can treat RF Tx/Rx in MR with a network perspective, where the subject and the RF coil structure are viewed as a multi-port network that interacts with a plurality of sources through the ports. On an MR scanner with well maintained linearity (a must for a quality scanner), there is a linear system relationship between the EM fields and the source configuration as described above. In particular, it can be shown that the net E field associated with the pth time interval can be expressed as a weighted superposition of E fields associated with the N ports employed for RF transmit, with the weights being $w_p^{(1)}, \ldots w_p^{(N)}$. This gives rise to the following expression for local RF energy dissipation:

$$\frac{\sigma}{2}|E_p(x)|^2 \Delta t = \frac{\sigma \Delta t}{2} E_p(x)^* \cdot E_p(x) = \frac{\sigma \Delta t}{2}\left(\sum_{m=1}^{N} w_p^{(n)} e^{(n)}(x)\right)$$

$$= [\ldots(w_p^{(m)})^*\ldots]\underbrace{\begin{bmatrix} \ldots & \ldots & \ldots \\ \ldots & \frac{\sigma \Delta t}{2}(e^{\underline{(m)}}(x))^* \cdot (e^{\underline{(n)}}(x)) & \ldots \\ \ldots & \ldots & \ldots \end{bmatrix}}_{\stackrel{def}{=}\Lambda(x)}\begin{bmatrix} \vdots \\ (w_p^{(n)}) \\ \vdots \end{bmatrix}$$

$$= w^H \Lambda(x) w$$

where $\Lambda$ is an N-by-N positive definite Hermitian matrix, $^H$ denotes conjugate transpose, * denotes complex conjugate and the underscored indices are row or column indices for vector/matrix entries.

The above equation indicates that local RF power dissipation can be expressed as quadratic functions in $w^{(1)}, \ldots$ and $w^{(N)}$. In matrix form, for the pth time interval, $h_e = w^H \Lambda w$, where $w = [w^{(1)} \ldots w^{(N)}]^T$ is a vector collecting the magnitude-phase pairs the N RF pulse sequences define for the time interval. It follows that overall RF energy dissipation in the same time interval can also be described by a quadratic model:

Exemplary equation 4

$$\xi_p = \Delta t \int_V \frac{\sigma(x)}{2}|E_p(x)|^2 dv =$$

$$[\ldots(w_p^{(m)})^*\ldots]\underbrace{\begin{bmatrix} \ldots & \ldots & \ldots \\ \ldots & \Delta t \int_V \frac{\sigma(x)}{2}(e^{\underline{(m)}}(x))^* \cdot (e^{\underline{(n)}}(x)) dv & \ldots \\ \ldots & \ldots & \ldots \end{bmatrix}}_{\stackrel{def}{=}\Phi}\begin{bmatrix} \vdots \\ (w_p^{(n)}) \\ \vdots \end{bmatrix} =$$

$$w^H \Phi w$$

where $\Phi$ is an N-by-N positive definite Hermitian matrix.

It is appropriate to call $\Lambda$ and $\Phi$ local and global power correlation matrices respectively. They capture the effects of field interactions and tissue conductivity on regional and overall RF energy deposition. Total dissipated RF energy during RF excitation is a time integral of $\xi_p$, expressed as:

Exemplary equation 5

$$\xi = \sum_{p=1}^{P} \xi_p = \sum_{p=1}^{P}[\ldots(w_p^{(m)})^*\ldots]\Phi\begin{bmatrix} \vdots \\ (w_p^{(n)}) \\ \vdots \end{bmatrix} = w_{full}^H \Phi_{full} w_{full},$$

$$\Phi_{full} = \begin{pmatrix} \Phi & & 0 \\ & \ddots & \\ 0 & & \Phi \end{pmatrix}_{NP \times NP}$$

where $w_{full}$ is a vector collects a complete set of weights (i.e., the magnitude and phase pairs that define the RF pulses). Similarly, Exemplary equation 6

$$\xi(x) = \sum_{p=1}^{P}\xi_p(x) =$$

$$\sum_{p=1}^{P}[\ldots(w_p^{(m)})^*\ldots]\Lambda(x)\begin{bmatrix} \vdots \\ (w_p^{(n)}) \\ \vdots \end{bmatrix} = w_{full}^H \begin{pmatrix} \Lambda(x) & & 0 \\ & \ddots & \\ 0 & & \Lambda(x) \end{pmatrix}_{NP \times NP} w_{full}$$

quantifies total RF energy at location x over the course of the RF excitation.

It is to be noted that in characterizing SAR, even in the absence of inter-coil coupling, RF energy dissipation locally or averaged over an imaging volume cannot be treated by considering the individual sources in isolation. This can be attributed to the overlapping of E fields. Quantitatively this is reflected in the typically non-zero correlation terms in $\Lambda$ and $\Phi$—these terms quantify the mutually interfering nature amongst the sources and encapsulate information required for effective SAR reduction. Existing shimming/RF pulse calculations that use plain or weighted sum of squares of the source samples ignore the mutual interference effect of multi-port transmit and are subject to significant error in tracking and managing SAR.

For a system equipped with proper sensors, e.g., power sensors 82 as shown in FIG. 2, $\Phi$ can be determined in a calibration process. When the sensors are power sensors that provide forward and reflected power readings for the ports, one approach is to determine $\Phi$ by processing the power readings from experiments that employ a set of appropriately selected input configurations. By the law of conservation of energy, $\Sigma p_{fwd} - \Sigma p_{rfl}$, the net RF power injected into the N-port network, is equal to the overall power dissipation in the network. Given $w_q$, an input configuration, $\Sigma p_{fwd} - \Sigma p_{rfl}$, the net RF power dissipation calculated from the sensors readings, is therefore related to $w_q$ by:

$$\Sigma p_{fwd,q} - \Sigma p_{rfl,q} = w_q^H \Phi w_q = \Sigma w_{q,i} * w_{q,j} \Phi_{ij}, \quad \text{Exemplary equation 7}$$

where $w_{q,i}$ and $w_{q,j}$ denote, respectively, the ith and jth entries of $w_q$. Eqn.7 is a linear equation with $\Phi_{ij}$, the entries of $\Phi$, as the unknowns, and product terms, $w_{q,i}*w_{q,j}$, as the coefficients.

One can readily probe the RF loss characteristic of the multi-port network by conducting a set of experiments. The power sensor readings and the source configuration of each experiment allow assembling of an Eqn.7-type linear equation; pooling an adequate number of equations then allows the calculation of all the entries of $\Phi$. Let $d_q$ denote a vector that collects all the $w_{q,i}*w_{q,j}$ terms following a certain order. An important consideration that goes into the selection of the input configurations is to make the $d_q$'s (q=1,2, . . . ) linearly independent. From the perspective of making the calculation of the $\Phi_{ij}$'s robust against perturbation, it is desirable to select the input configurations in such a way that renders the condition number of the matrix $[d_1 d_2 \ldots]$ small (e.g., by making the matrix orthogonal).

When the sensors support phase-sensitive detection, an alternative approach is to determine $\Phi$ using the principle of reciprocity. Specifically, based on the noise covariance matrix $\Psi$ corresponding to the multi-port system, which is obtained with the receivers connected with the multiple ports, $\Phi$ can be calculated using $$\Phi = L_1^H \Psi^T L_1,$$

where transformation matrix $L_1$ accounts for the fact that in general the preamplifiers in the front of the receivers present to the multi-port network a different set of impedance during Rx than the power amplifiers do during Tx ($L_1$ is an identity matrix in the special case where the ports all see 50 Ω during both Tx and Rx).

In stead of explicitly measuring the noise covariance matrix, one may choose to derive $\Psi$ using the multi-port network's scattering matrix S and Bosma's theorem:

$$\Psi = kTL_2^H(I-SS^H)L_2,$$

which in turn, allows calculation of $\Phi$ using $$\Phi = L_3^H(I-SS^H)^T L_3 = L_3^H(I-S^H S)L_3.$$

Note that $L_1$, $L_2$ or $L_3$ could be determined following separate calibrations.

To spatially resolve RF energy deposition in vivo by non-invasive means is possible. MR thermometry, when performed with high accuracy, can not only map temperature, but also provide inputs for determining $\Lambda(x)$ and hence the quantitative local SAR prediction models. This can be explained using the Pennes Bio-heat equation, which suggests that if an RF transmit experiment is conducted at a time scale short enough compared to that of the heat conduction, the local RF energy deposition rate is proportional to local temperature rise, i.e., $\Delta T \propto h_e = \frac{1}{2}\sigma |E|^2$. At location x inside the body one can therefore use the $\Delta T$ measurements from MR thermometry to determine $\Lambda(x)$:

$$\frac{1}{2}\sigma|E|^2 = w_q^H \Lambda w_q = \Sigma_{ij} w_{q,i} {}^* w_{q,j} \Lambda_{ij} \qquad \text{Exemplary equation 8}$$

As indicated by the form of Eqn.8, the same principle used to determine $\Phi$ can be used to determine $\Lambda(x)$. The difference is that one now uses $\Delta T$ from thermometry as sensor data in solving the linear equations for $\Lambda_{ij}$.

One obstacle in calibrating local SAR prediction model with MR thermometry is the precision/dynamic range of temperature mapping achievable under in vivo condition. This is not a fundamental limitation however. Rather than pursuing highly accurate maps/predictions of local temperature rise, one strategy is to avoid extreme incidences that violates the FDA limits on local SAR, incidences that might not be 100% caught and mitigated if one relies only upon global SAR monitoring, prediction and management. With the knowledge of the (modest) magnitude of local SAR modeling error, one can build a corresponding safety margin in RF pulse calculations. An accurate prediction of overall RF deposition in the subject together with a reasonably accurate prediction of heating distribution, offers a new capability that will enable one to effectively apply transmit optimization and minimize SAR in vivo.

The departure from the conventional practice of striving for B1 homogeneity over an extended 3D space with a volume coil offers parallel transmit a potent leverage to ameliorate the SAR issue. Intuitively, when the imaged region is a fraction of the subject section covered by the transmit coil, optimized use of the coil structure such that, for instance, portions of the structure near the imaged region contribute more than the rest, can avoid unnecessarily high RF power dissipation.

To explicitly conduct the optimization in practice, a constrained optimization framework can be employed which formulates SAR reduction problem as, given the dependencies of the SAR and transverse magnetization on the RF pulses, searching for a set of RF pulses that produces a desired flip-angle profile while inducing minimum SAR. An unconstrained optimization framework that is amenable to faster numerical solution can be an alternative, where one makes compromises on profile accuracy and searches for a set of RF pulses that minimizes a weighted sum of profile error and SAR. Either search requires that the quantitative dependence of SAR on RF pulses be explicitly known.

An exemplary method is hereby described with respect to incorporating means for predicting RF energy transmission/dissipation into the calculation of RF excitation pulses.

Given prediction models such as quadratic functions in the form of $w^H \Phi w$ (and $w^H \Lambda w$ for local) for relating SAR values to RF pulses, one can design RF pulses with guidance from models. This allows the extra degrees of freedom inherent in a parallel transmit system be advantageously exploited, effecting E field tailoring and SAR reduction. Examples given below illustrates integration into constrained or unconstrained optimization framework a quadratic function-based metric that is constructed with calibrated power correlation matrices.

For reducing global SAR, the metric is the $\xi$ defined by Eqn.5. For reducing local SAR, the metric is Exemplary equation 9

$$\xi_{local} = \sum_{l=1}^{L} \eta_l \xi(x_l) = w_{full}^H \Lambda_{full} w_{full},$$

$$\text{where } \Lambda_{full} = \begin{pmatrix} \sum_{l=1}^{L} \eta_l \Lambda(x_l) & & 0 \\ & \ddots & \\ 0 & & \sum_{l=1}^{L} \eta_l \Lambda(x_l) \end{pmatrix}_{NP \times NP}$$

$\xi_{local}$ is a weighted summation of regional RF energy dissipation values (Eqn.6) over all locations of interest. $\eta_l$'s, the non-negative weights, assigns relative importance of reducing SAR amongst the locations. Integrating the global and local SAR metric into the constrained- or unconstrained-optimization based parallel transmit pulse calculation has the effect of steering the search to RF pulse waveforms that minimize SAR. This is because selection of other waveforms faces an increased penalty due to elevated values of the metric. Illustrations are given below for designing SAR-optimized parallel excitation pulses.

For the small-tip-angle regime or its large-tip-angle extension, given a general k-space trajectory one can use the following method to design the parallel transmit RF pulses:

$$\text{argmin}_{w_{full}} \{ (E_{full} w_{full} - u_{full})^H \Omega (E_{full} w_{full} - u_{full}) + \alpha w_{full}^H \Phi_{full} w_{full} + \beta w_{full}^H \Lambda_{full} w_{full} \} \qquad \text{Exemplary equation 10}$$

$\Omega$ is a diagonal matrix containing weights for all locations in the field of view to emphasize important regions (e.g., assigning ones and zeros to important and don't-care regions respectively, and/or heuristically-chosen fractional values reflective of relative importance of excitation profile accuracy at locations in the field of view). $\alpha$ and $\beta$, positive parameters, control the emphasis on SAR reduction vs. excitation profile accuracy. Large $\beta$ and $\eta_1$ values additionally curb elevation of SAR in locations of interest. The present example uses power correlation matrices instead of an identity matrix. This has the advantage of having the second and third terms not only help improve the robustness of the numerical inversion (regularization effect), but accurately track SAR and make SAR minimization a key criteria in picking a pulse design. This is an important improvement: For instance, given a set of parallel RF pulses, one can add a 180° phase offset to one of the pulses without affecting the evaluation of $w^H Iw$—the term is incapable of capturing the SAR effect caused by the constructive/destructive interference of the E fields driven by the pulses. Use of identity matrix I further assumes equal contributions from the channels, which is not true in any case where different ports contribute differently to SAR when driven by the same RF pulse.

A constrained optimization counterpart to Eqn.10 is minimize $w^H_{full}(\alpha\Phi_{full}+\beta\Lambda_{full})w_{full}$ subject to $E_{full}w_{full}-u_{full}=0$.  Exemplary equation 11

Eqn.11 emphasizes excitation profile accuracy, but is less amenable to fast numerical solution.

One can further integrate SAR minimization with techniques that optimize k-space sampling. Given a transmit setup and a target excitation profile, previously introduced Subspace Orthogonal Matching Pursuit method significantly increases k-space undersampling (hence shortens excitation pulses) by pruning columns of the $E_{full}$ matrix one group at a time. A better approach is to use a modified criteria that not only considers a column group's contribution to the creation of the target profile but its consequence on SAR: at the $j^{th}$ iteration, in determining a group G and its associated pulse waveform samples w, one picks the G and w that minimize:

$$w^H\left(\alpha\Phi+\beta\sum_{l=1}^{L}\eta_l\Lambda(x_l)\right)w+\lambda\left\|[E^{(j-1)}G]\begin{bmatrix}w^{(j-1)}\\w\end{bmatrix}-u_{full}\right\|_\Omega +$$

$\|\text{projection of (profile error)}^{(j-1)} \text{ onto } \text{span}\{G\}\|^{-1}$ This represents an improvement as the new pulse design optimizes, simultaneously and with a controllable balance, excitation profile accuracy, SAR and pulse length.

For large-tip-angle parallel transmit pulse design, one can extend an optimal control-based method to accommodate effective SAR minimization:

minimize $[M(T)-D]^T\Omega[M(T)-D]+\int_{=0}^T w^H(t)(\alpha\Phi+\beta\Sigma_{l=1}^L\eta_l\Lambda(x_l))w(t)dt$ subject to $\dot{M}(t)=[A(t)+\Sigma_{n=1}^{N}B^{(n)}u^{(n)}(t)+\Sigma_{n=1}^{N}C^{(n)}v^{(n)}(t)]M(t)$ With a control system representation of the Bloch equation, this formulation spells out the requirement that the real (u(t)) and imaginary (v(t)) components of the RF pulse waveforms need to drive the magnetization profile (the state vector M(t)) towards the target excitation profile D (the target state). Notice the metric to be minimized has a term penalizing the deviation of the final state from the target state and a further term penalizing large SAR. For the large-tip-angle regime, accurate tracking and explicit minimization of SAR is especially desirable as highly effective SAR management opens new opportunities of MR applications by enabling or facilitating the use of larger flip-angle/higher RF duty-cycle imaging sequences.

B1 shimming may be treated using a size-reduced version of Eqn.10. To further improve performance, one may completely relax the phase requirement, i.e. one targets uniformity of resulting profile's magnitude but ignore its phase spatial variation. The problem is then formulated as:

$\operatorname{argmin}_w\{(|Ew|-|u_{full}|)^H\Omega(|Ew|-|u_{full}|)+w^H(\alpha\Phi+\beta\Sigma_{l=1}^L\eta_l\Lambda(x_l))w\}$ where w is an N×1 vector containing the shimming coefficients, E contains the B1+ samples (no more gradient encoding effects), and $u_{full}$ represents the target uniform B1+ profile.

Optimizing RF coil currents' magnitude/phase, temporal modulation and spatial distribution is crucial to MR imaging performance. One key prerequisite for the optimization is the knowledge of B1 spatial distribution and E-induced RF loss associated with a coil current pattern or a source configuration. This is addressed with B1 mapping and power correlation matrix calibration. Another key prerequisite for the optimization is a hardware infrastructure that facilitates the optimization. An exemplary approach is directed to a new RF coil structure that not only supports most flexible current path control, allowing for different current patterns with the same conductor geometry, but substantially simplifies RF coil fabrication. An RF coil that is of such a structure and is supportive of multi-channel or multi-port Tx/Rx is named a constellation coil.

Compared to a conventional parallel Tx/Rx coil, a constellation coil's sections that correspond to the multiple channels or ports are not necessarily isolated from each other. Instead the sections tend to couple to each other capacitively, inductively, or through direct connection. While decoupling between the sections is of secondary importance, the structure does emphasize several characteristics that constitute a foundation for high performance parallel Tx/Rx operations. This has far reaching impact on the fabrication and use of RF coils in MR imaging. These are discussed below using an exemplary constellation coil implementation.

Figure 3A:
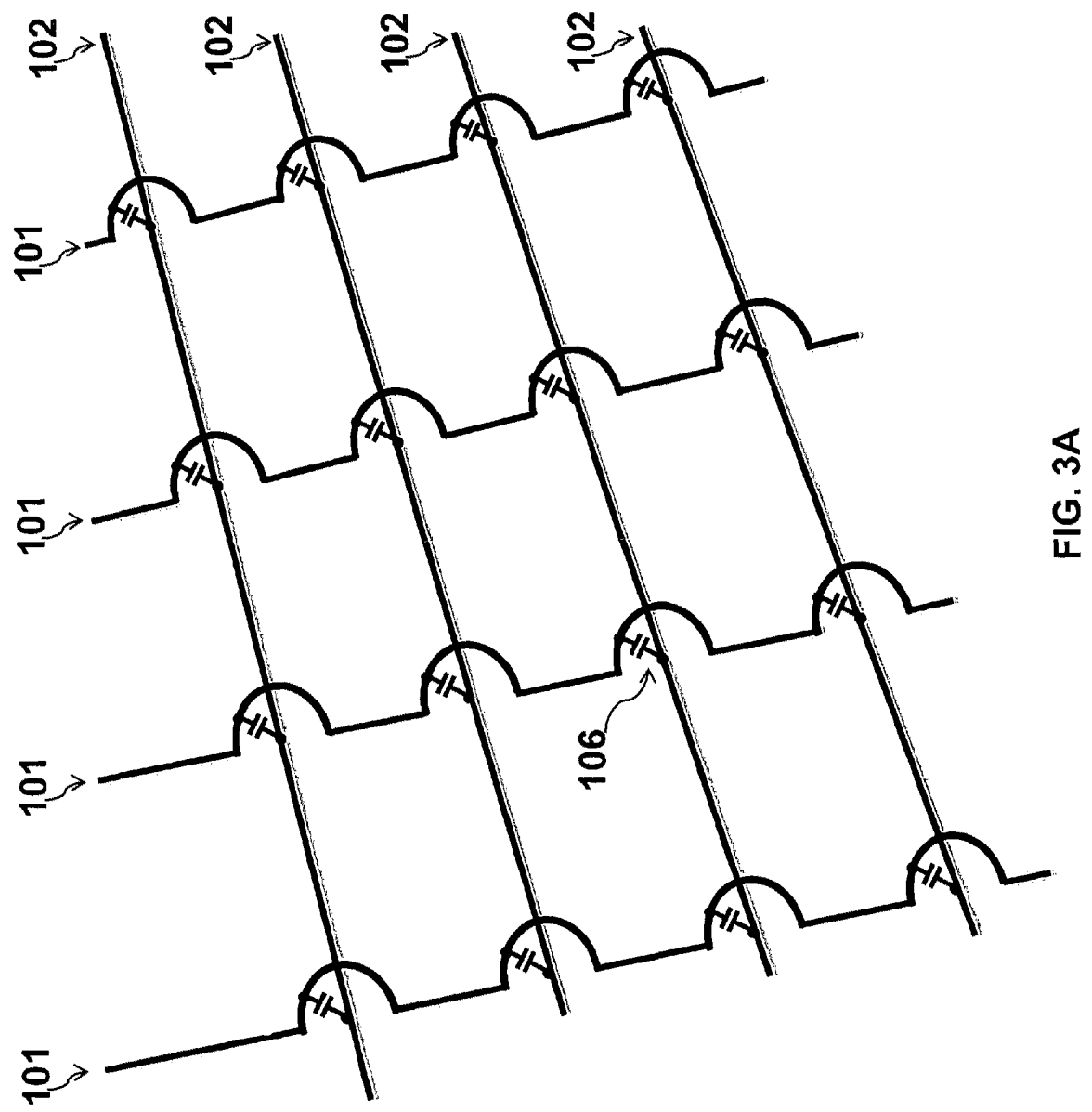
FIG. 3 is an illustration of an exemplary constellation coil assembly in accordance with another aspect of the present invention.
Figure 3B:
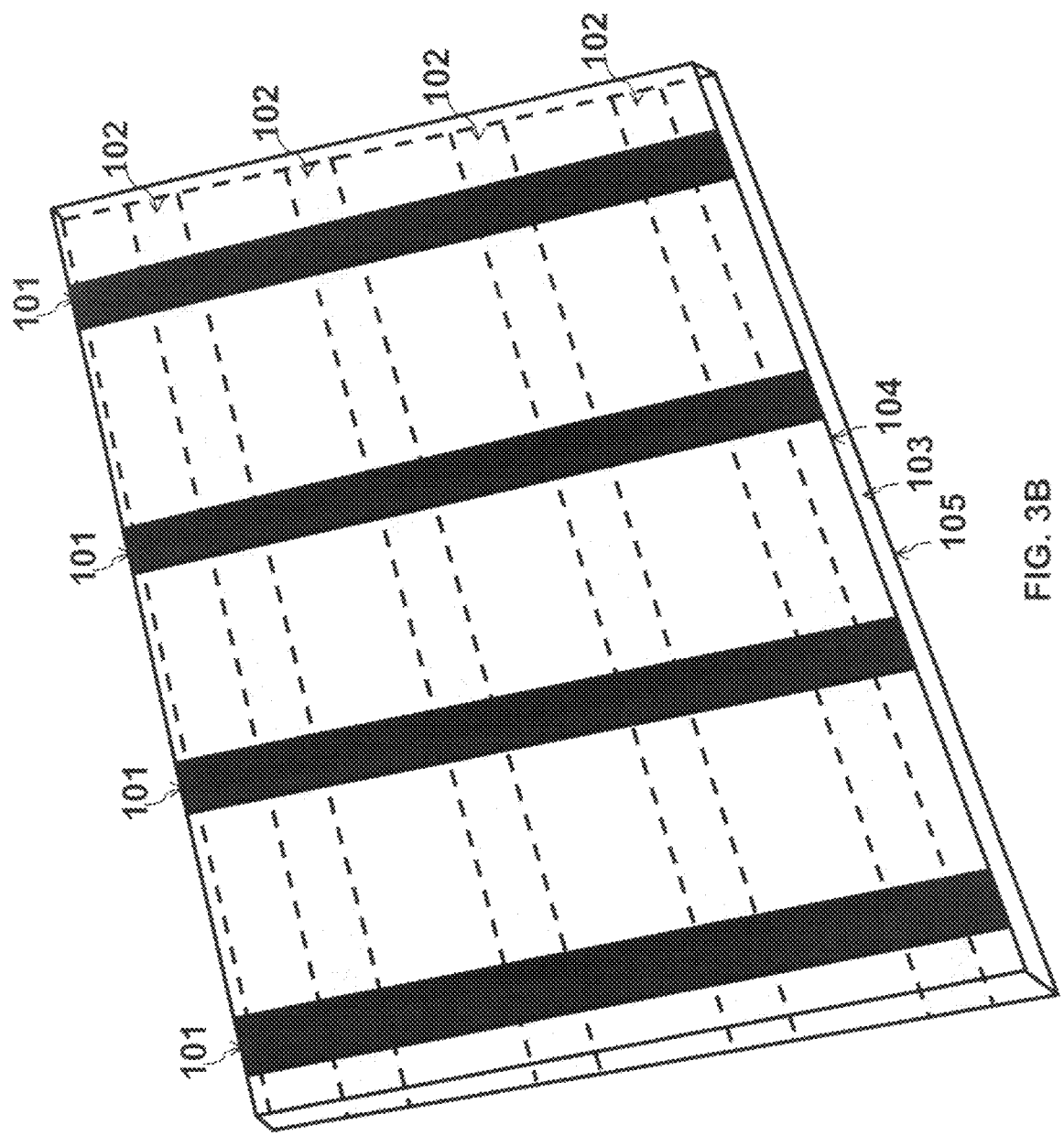

An exemplary constellation coil assumes a grid pattern, where multiple sets of conductors stay on different physical layers and are capacitively coupled at grid point locations. One efficient coil construction method is to fabricate the multiple sets of conductors on multiple layers of high dielectric-constant substrates, with each layer of substrate sandwiched between two sets of conductors. FIG. 3B illustrates a version involving two sets of conductors (101 and 102). The top set 101 is etched on the top side 104 of a substrate 103. The bottom set 102 is etched on the bottom side 105 of the substrate 103. The substrate is of relatively high dielectric constant, which, along with such factors including the thickness of the substrate and the conductor width/shape around the grid point locations, sets a significant capacitive coupling as illustrated with the capacitors 106 shown in equivalent circuit representation FIG. 3A.

It is desirable to fabricate the coil such that the capacitors are of relatively small reactance at the Larmor frequency but large reactance at audio frequencies. Such a characteristic allows RF currents to run through the capacitors. When the separation between the roughly parallel conductors is small, the dense grid structure approaches a continuous conducting structure for the RF currents, making the structure behave like a RF shield to some extent. The continuum provides the support for accommodating sophisticated RF current patterns required to enhance parallel Tx/Rx performance. In the meantime the structure remains transparent to the audio-frequency gradient field as the field cannot induce significant currents in the grid.

The constellation coil promises to be an ultimate parallel RF antenna—it targets SNR and SAR performance enhancement based on electrodynamics principles, focusing on optimizing current distribution that is the foundation of the performance-dictating B1 and E fields. It offers several breakthroughs over a conventional coil:

First, a conventional coil's structure is too discrete to flexibly support complex current patterns desired of Tx/Rx in high field MR, and coupling/mode structure put additional constraints on current flow. Segments of a constellation coil are well coupled, approximating a mesh-type RF shield to maximize support for complex/broadband RF current patterns without having to deal with decoupling or mode structure. Desired current patterns are realized by driving/receiving from the constellation coil structure through distributed multiple ports (the constellation), as analyzable with Kirchhoff's current law. In practice this can be done using predetermined parallel Tx RF pulses/parallel Rx image reconstruction based on calibrated $B1^+/B1^-$ sensitivity maps and power-/noise-correlation matrices. Explicit knowledge of current patterns or special RF pulse design/image reconstruction is not required.

Second, RF loss may be better managed in the constellation coil case. Direct E field coupling to the sample, a significant loss mechanism in high field MR, is expected to be much reduced with the amount and density of distributed capacitance across the coil structure. The densely populated conductors collaborate in conducting currents, having the tendency to lower the resistance seen by the RF currents. Easier integration with new conductor material, e.g., carbon nanotubes, may offer possible further reduction in conductor loss.

Third, for a conventional coil to work robustly, sophisticated design, construction, tuning and testing are required. Examples of substantial challenges include tuning of individual coil elements in the presence of complex interactions amongst the elements, integration of large amount of parts (capacitors, inductors, and blocking or enabling-disabling circuits), and the management of failure modes. The fact that one structure may not perform adequately for Tx, Rx, various parts of the body, multiple frequencies and various parallel MR acceleration configurations, further leads to the need for a large arsenal of coils that are costly to operate/maintain in clinical practice.

The constellation coil idea reflects a belief that field optimization based SNR/SAR performance enhancement is a sensible way to go. Conventional approaches based on trying to make individual coils work together are not only costly, less robust, overly application specific, and extremely challenging in a massively parallel setting, but too constraining to possibly bring MR signal induction/detection performance to a new level, approaching the ultimate performance allowed by electrodynamics.

Figure 4:
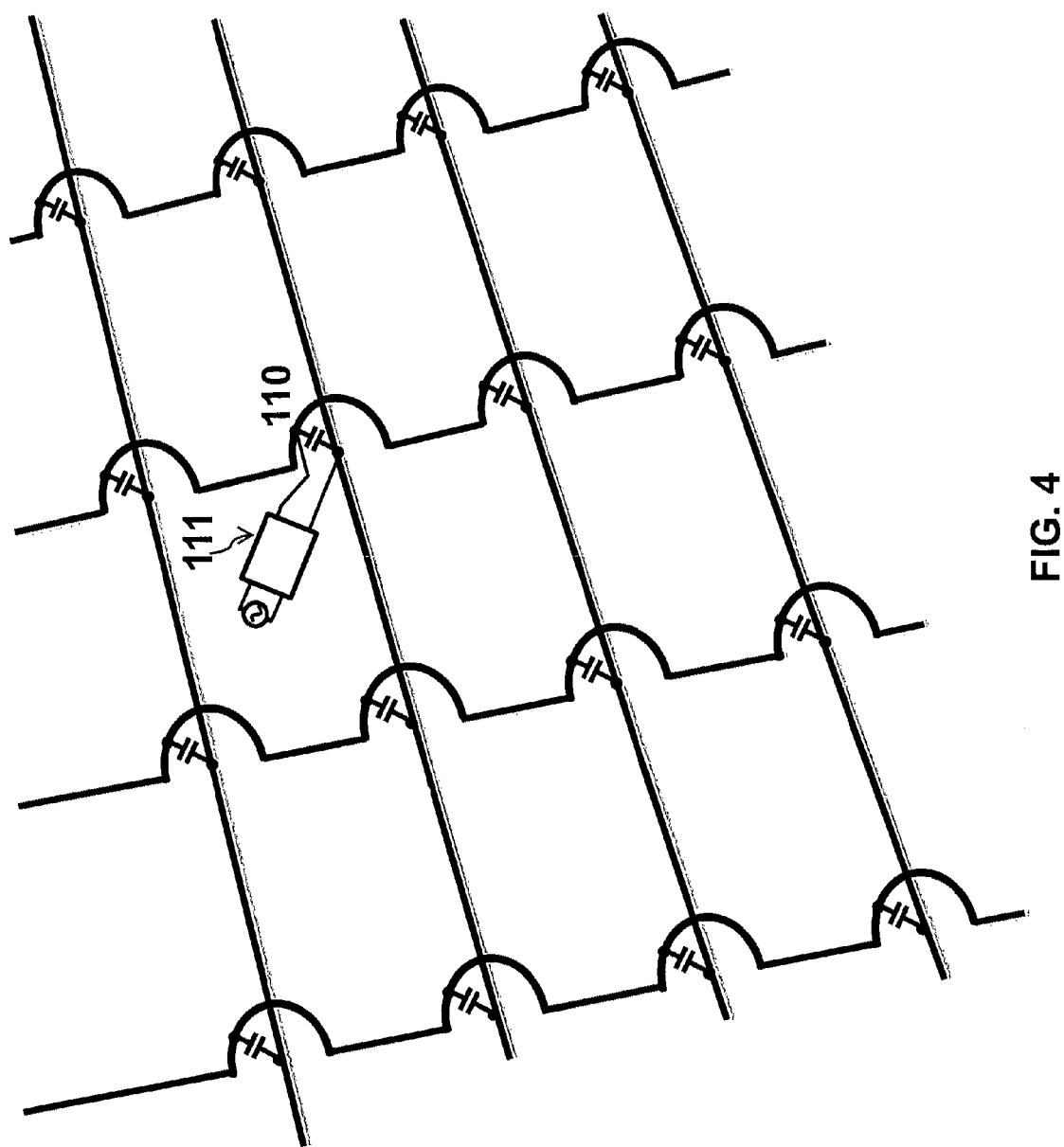
FIG. 4 is an illustration of the constellation coil with an added exemplary port.
Figure 5:
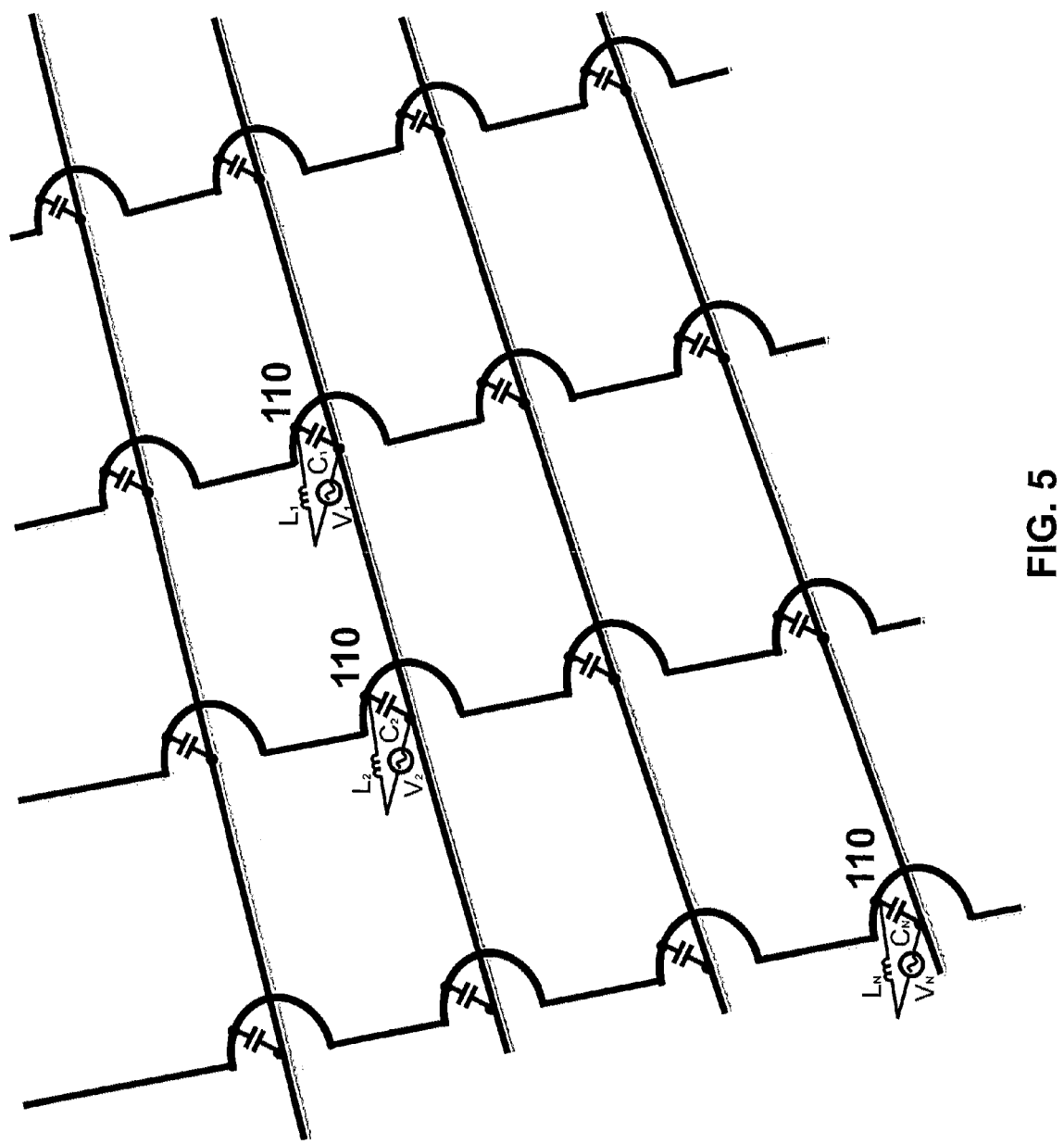
FIG. 5 is an illustration of the constellation coil with N added exemplary ports.

As illustrated in FIG. 4, when adding a port 110 to the constellation coil, if desired a matching network 111 could be introduced to achieve matching. For Rx, a main goal of the matching is to make the preamplifier in the front of the receiver see an impedance that makes the preamplifier operate in low noise-figure regime. For Tx, the main goal is to make the power amplifier see an impedance that makes the amplifier capable of outputting maximum power. FIG. 5 further illustrates an example implementation of a constellation coil with N ports 110. For the nth port, if desired an additional capacitor could be added in parallel to $C_n$. The capacitor(s) together with the inductor in series, $L_n$, constitute the matching network, which has an additional property of being capable of converting low input impedance of a preamplifier/low output impedance of a power amplifier into a very high impedance. If further desired, a general multiple-input and multiple-output interface/matching network can be employed to facilitate matching.

While the above descriptions of systems and methods contain many specificities, these should not be construed as limitations on the scope of any embodiment, but as exemplifications of the presently preferred embodiments thereof. Many other ramifications and variations are possible within the teachings of the various embodiments. For example, the establishment of the field and RF loss prediction models can employ other sensor data including field measurements, transmission measurements and a variety of MR signals. Further, the constellation coil concept is not restricted to the illustrated planar geometry or two sets of conductors. The concept is readily applicable to cylindrical geometry, spherical geometry and other wrap-around geometry, as well as very sophisticated geometry that conform to the object shape. Multi-layer structure can be fabricated and can offer additional advantages. Rigid or flexible/elastic material can be used to achieve desired properties. Use of carbon nanotube or superconducting material can help maximize performance.

What is claimed is:

1. A radio frequency antenna apparatus for use in a magnetic resonance system, comprising:
   a. an antenna structure of an approximately mesh-like form for carrying radio frequency current, said antenna structure comprising
      i. conductor segments dispersed on a plurality of layers, and
      ii. capacitive or inductive coupling junctures at a multitude of locations, said coupling junctures connecting electrically said conductor segments into an approximately mesh-like form,
   b. interface means for interfacing a magnetic resonance system's radio frequency subsystem to said antenna structure at at least one spatial location for effecting control of radio frequency current distribution on said antenna structure,
   whereby said antenna apparatus performs radio frequency transmit/receive with substantially continuous and versatile current distribution patterns.

2. The radio frequency antenna apparatus of claim 1 wherein said interface means comprises a plurality of ports distributed on said antenna structure.

3. The radio frequency antenna apparatus of claim 2 wherein said ports each comprises an impedance transformation circuitry.

4. The radio frequency antenna apparatus of claim 1 wherein said control of radio frequency current distribution comprises predetermined radio frequency pulses for the transmit mode of said magnetic resonance system and, in effect, predetermined magnetic resonance signal/data combination for the receive mode of said magnetic resonance system.

5. The radio frequency antenna apparatus of claim 4 wherein said radio frequency pulses and said magnetic resonance signal/data combination are predetermined using information selected from the group comprising beforehand acquired power measurements, radio frequency field measurements, noise measurements, and magnetic resonance signal/data.

6. The radio frequency antenna apparatus of claim 5 wherein the predetermination employs numerical models predicting a plurality of aspects of magnetic resonance imaging, said aspects being selected from the group comprising radio frequency energy transmission/dissipation, flip angles, image contrast, and signal-to-noise ratio.

7. A method for effecting electromagnetic field spatiotemporal variations with a multitude of interconnected current-carrying paths, comprising:
   a. providing at least one antenna structure, each said antenna structure comprising multiple layers of conductor segments sandwiching at least one flat or curved sheet of non-conducting material thereby forming a network of electrically interconnected paths for accommodating radio frequency current spatiotemporal variations,
   b. providing interfacing means for interfacing a magnetic resonance system's radio frequency subsystem to said antenna structure at at least one spatial location thereby effecting control of radio frequency current distribution on said antenna structure, c. providing current control means, comprising radio frequency pulses for transmit and signal/data combination for receive, whereby said method facilitates creation of diverse electromagnetic field spatiotemporal variations, including variations that enhance effectiveness of radio frequency transmit/receive.

8. The method of claim 7 wherein said antenna structure assumes a grid pattern, said grid pattern being sufficiently dense for creating sophisticated radio frequency current spatial variations.

9. The method of claim 8 wherein said grid pattern is formed with conductors distributed on a plurality of layers, each of said layers accommodating substantially parallel conductor segments.

10. The method of claim 7 wherein said non-conducting material is dielectric material of preferably high dielectric constant.

11. The method of claim 7 wherein said radio frequency pulses and said signal/data combination are predetermined using information selected from the group comprising beforehand acquired power measurements, radio frequency field measurements, noise measurements, and magnetic resonance signal/data.

12. The method of claim 11 wherein the predetermination employs numerical models predicting a plurality of aspects of magnetic resonance imaging, said aspects being selected from the group comprising radio frequency energy transmission/dissipation, flip angles, image contrast, and signal-to-noise ratio.

13. The method of claim 12 wherein said numerical models comprise a quadratic function component for predicting radio frequency energy transmission/dissipation based on definitions of said radio frequency pulses, said quadratic function component having parameters predetermined using information including beforehand acquired power measurements.

14. The method of claim 7 wherein said signal/data combination scheme is an magnetic resonance image reconstruction algorithm.

15. A method for effecting electromagnetic field spatiotemporal variations with a network of current-carrying paths, comprising:

a. providing measurement means for quantifying effects of radio frequency wave propagation, b. obtaining a finite number of measurements with said measurement means, c. providing a prediction means based on said finite number of measurements, said prediction means predict effects of radio frequency wave propagation, including energy transmission/dissipation, due to transmission of any predetermined radio frequency pulses, d. applying said prediction means in the calculation of radio frequency pulses that are to energize a network of current-carrying paths, e. energizing said network of current-carrying paths with said radio frequency pulses to effect electromagnetic field spatiotemporal variations, whereby said prediction means and said calculation of radio frequency pulses proactively manage radio frequency energy transmission/dissipation.

16. The method of claim 15 wherein the prediction means comprising a numerical model predetermined using radio frequency wave propagation measurements.

17. The method of claim 16 wherein said numerical model comprises a quadratic function component for predicting radio frequency energy transmission/dissipation with definitions of said radio frequency pulses, said quadratic function component having parameters predetermined using information including beforehand acquired power transmission measurements.

18. The method of claim 15 wherein said calculation incorporates said prediction means by formulating and solving an optimization problem using as inputs at least a quadratic-form formula for predicting radio frequency energy dissipation, said optimization producing as outputs definitions of radio frequency pulses.

19. The radio frequency antenna apparatus of claim 1 wherein said conductor segments comprise material of high conductivity.

20. The method of claim 7 wherein said conductor segments comprise material of high conductivity.

* * * * *